United States Patent
Tsai et al.

(10) Patent No.: US 9,142,404 B2
(45) Date of Patent: Sep. 22, 2015

(54) SYSTEMS AND METHODS FOR ANNEALING SEMICONDUCTOR DEVICE STRUCTURES USING MICROWAVE RADIATION

(71) Applicant: Taiwan Semiconductor Manufacturing Company Limited, Hsinchu (TW)

(72) Inventors: Chun-Hsiung Tsai, Hsinchu County (TW); Xiong-Fei Yu, Hsinchu (TW); Kuo-Feng Yu, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 65 days.

(21) Appl. No.: 14/054,904

(22) Filed: Oct. 16, 2013

(65) Prior Publication Data

US 2015/0104933 A1    Apr. 16, 2015

(51) Int. Cl.
*H01L 21/02* (2006.01)
*H05B 6/80* (2006.01)
*H01L 21/324* (2006.01)

(52) U.S. Cl.
CPC ........ *H01L 21/02345* (2013.01); *H01L 21/324* (2013.01); *H05B 6/80* (2013.01)

(58) Field of Classification Search
None
See application file for complete search history.

(56) References Cited

U.S. PATENT DOCUMENTS

| | | | |
|---|---|---|---|
| 2009/0184399 A1* | 7/2009 | Kowalski et al. | 257/618 |
| 2010/0120263 A1* | 5/2010 | Hsueh et al. | 438/795 |
| 2012/0187523 A1* | 7/2012 | Cummings et al. | 257/506 |

* cited by examiner

*Primary Examiner* — Scott B Geyer
(74) *Attorney, Agent, or Firm* — Jones Day

(57) ABSTRACT

Systems and methods are provided for annealing a semiconductor device structure using microwave radiation. For example, a semiconductor device structure is provided. An interfacial layer is formed on the semiconductor device structure. A high-k dielectric layer is formed on the interfacial layer. Microwave radiation is applied to anneal the semiconductor device structure for fabricating semiconductor devices.

19 Claims, 3 Drawing Sheets

SYSTEMS AND METHODS FOR ANNEALING SEMICONDUCTOR DEVICE STRUCTURES USING MICROWAVE RADIATION

FIELD

The technology described in this patent document relates generally to semiconductor materials and more particularly to processing of semiconductor materials.

BACKGROUND

Modern silicon-based transistors often include a high-k dielectric layer as gate dielectric. For example, a silicon-based transistor is fabricated using a complementary-metal-oxide-semiconductor (CMOS) process flow. As shown in FIG. 1, a high-k dielectric layer 102 (e.g., $HfO_2$) is often formed on an interfacial layer 104 (e.g., $SiO_2$) grown on a silicon substrate 106 for fabricating the transistor 100. Dipole effects often occur at the interface between the high-k dielectric layer 102 and the interfacial layer 104, as shown in FIG. 2. The interfacial layer 104 may have a larger areal density of oxygen atoms (i.e., a higher a), compared with the high-k dielectric layer 102. The difference in the areal density of oxygen atoms between the high-k dielectric layer 102 and the interfacial layer 104 is compensated by oxygen atoms transferring (e.g., in a form of $O^{2-}$) from the interfacial layer 104 to the high-k dielectric layer 102, leaving behind oxygen vacancies in the interfacial layer 104 (e.g., in a form of $V_O^{2+}$), which results in interface dipole effects. A post-high-k annealing process is often performed to repair defects and reduce the interface dipole effects between the interfacial layer 104 and the high-k dielectric layer 102 so as to improve device performance. Usually, rapid thermal annealing (RTA) is used for the post-high-k annealing process.

Other processes may also be involved for fabricating the transistor. For example, the silicon substrate is doped (e.g., adding desired impurities into the substrate) to form junctions. Dopants introduced into the substrate are usually electrically activated, and the activation of the dopants often includes transferring the dopant atoms/molecules from interstitial positions into lattice sites of the lattice structure of the substrate.

Under certain circumstances, the fabrication process of the transistor involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\in(\omega)^*$, which depends on the frequency of the electric field:

$$\in(\omega)^* = \in(\omega)' - i\in(\omega)'' = \in_0(\in_r(\omega)' - i\in_r(\omega)'') \qquad (1)$$

where $\omega$ represents the frequency of the electric field, $\in(\omega)'$ represents a real component of the complex permittivity (i.e., a dielectric constant), and $\in(\omega)''$ represents a dielectric loss factor. In addition, $\in_0$ represents the permittivity of a vacuum, $\in_r(\omega)'$ represents the relative dielectric constant, and $\in_r(\omega)''$ represents the relative dielectric loss factor.

Whether a material can absorb the microwave radiation can be characterized using a loss tangent, tan $\delta$:

$$\tan\delta = \frac{\varepsilon''\mu' - \varepsilon'\mu''}{\varepsilon'\mu' + \varepsilon''\mu''} \qquad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan\delta = \frac{\varepsilon''}{\varepsilon'} = \frac{\varepsilon_r''}{\varepsilon_r'} \qquad (3)$$

Materials with a low loss tangent (e.g., tan $\delta<0.01$) allow microwaves to pass through with very little absorption. Materials with an extremely high loss tangent (e.g., tan $\delta>10$) reflect microwaves with little absorption. Materials with an intermediate loss tangent (e.g., $10\geq\tan\delta\geq0.01$) can absorb microwave radiation.

SUMMARY

In accordance with the teachings described herein, systems and methods are provided for annealing a semiconductor device structure using microwave radiation. For example, a semiconductor device structure is provided. An interfacial layer is formed on the semiconductor device structure. A high-k dielectric layer is formed on the interfacial layer. Microwave radiation is applied to anneal the semiconductor device structure for fabricating semiconductor devices.

In one embodiment, a system for annealing a semiconductor device structure includes one or more energy-converting materials and a microwave-radiation source. The one or more energy converting materials are configured to increase an electrical field density associated with a semiconductor device structure in response to microwave radiation so as to increase the semiconductor device structure's absorption of microwave radiation. The microwave-radiation source is configured to apply microwave radiation to the energy-converting materials and the semiconductor device structure to anneal the semiconductor device structure for fabricating semiconductor devices. The semiconductor device structure includes a high-k dielectric layer on an interfacial layer.

DETAILED DESCRIPTION

Figure 1:
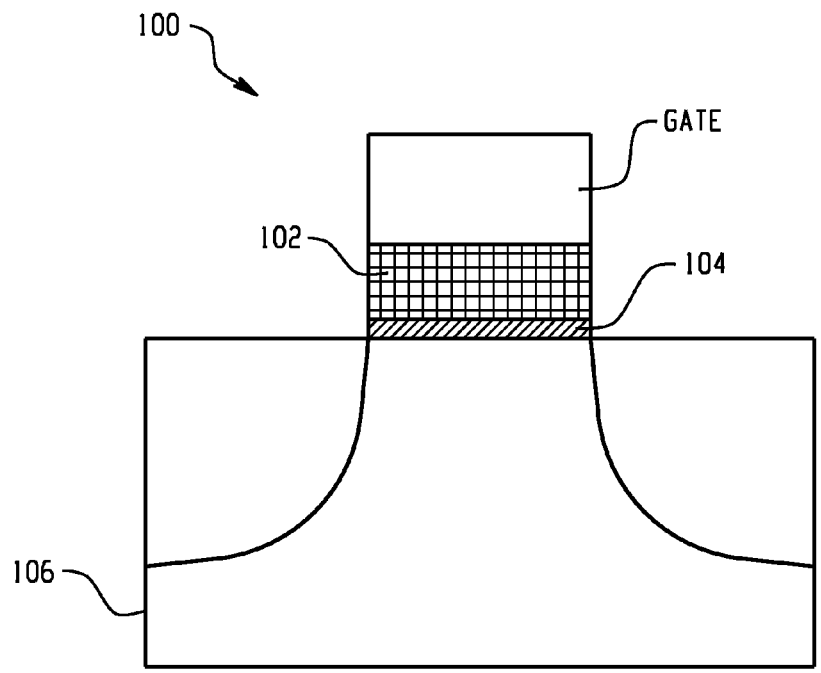
FIG. 1 depicts an example diagram showing a semiconductor device structure.
Figure 2:
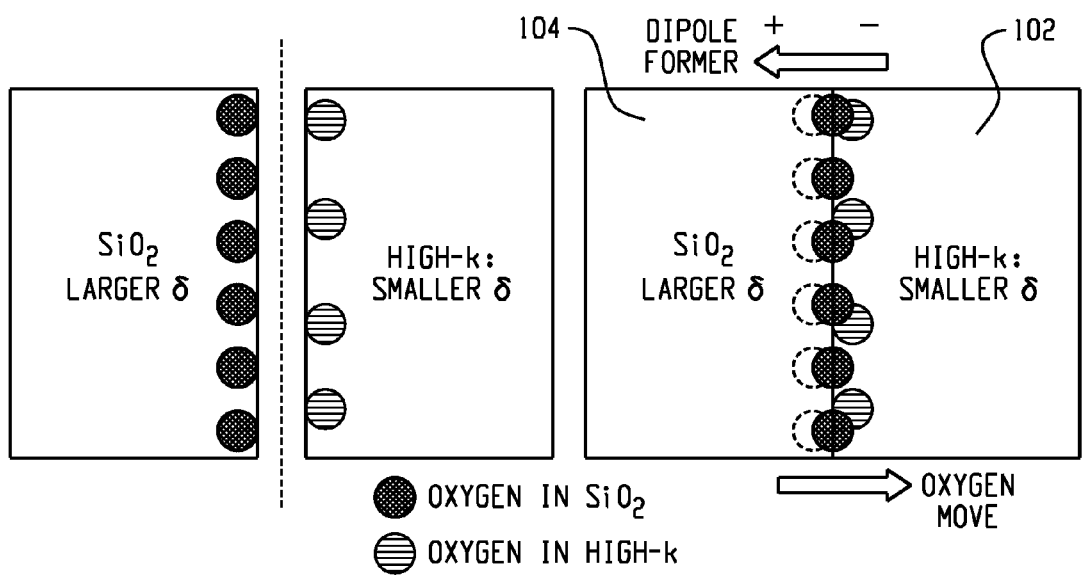
FIG. 2 depicts an example diagram showing dipole formation at an interface between an interfacial layer and a high-k dielectric layer.

Referring back to FIG. 1, the post-high-k annealing process is usually carried out at a high temperature (e.g., 800° C.)

for a period of time (e.g., 20 seconds). However, the high-temperature annealing may cause undesirable effects to the formed junctions, such as deactivation of dopants in the junctions and junction/channel strain relaxation. Furthermore, during the high-temperature annealing, the substrate 106 may be oxidized, which leads to an increase of the equivalent oxide thickness (EOT). When an excessive amount of oxygen diffuses into the interfacial layer 104 during the high-temperature annealing, O—Si dipoles may form at the interface between the substrate 106 and the interfacial layer 104, which causes a shift in a flat-band voltage.

Figure 3:
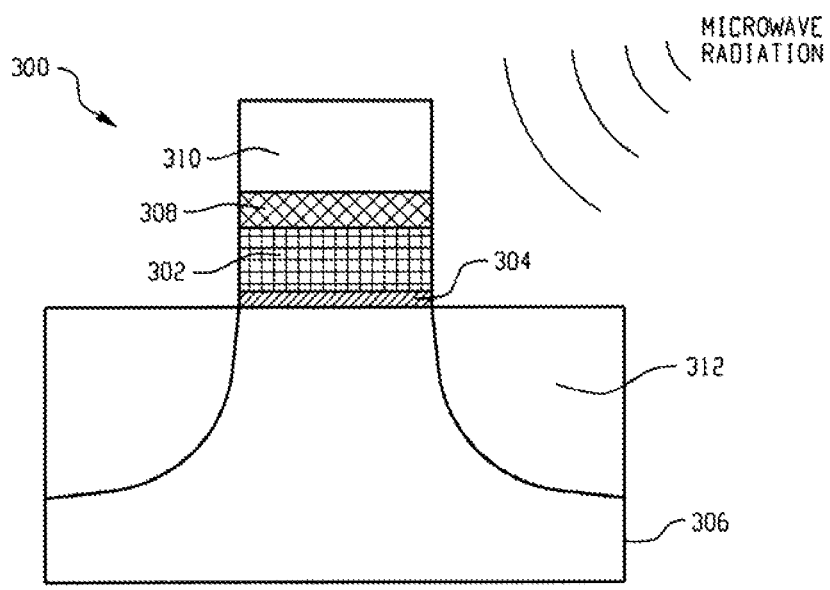
FIG. 3 depicts an example diagram for annealing a semiconductor device structure using microwave radiation.

FIG. 3 depicts an example diagram for annealing a semiconductor device structure using microwave radiation. As shown in FIG. 3, the semiconductor device structure 300 includes a high-k dielectric layer 302 formed on an interfacial layer 304 that is grown on a substrate 306. Microwave radiation is applied to anneal the semiconductor device structure 300 for fabricating semiconductor devices. As an example, the semiconductor device structure 300 includes a barrier layer 308 formed on the high-k dielectric layer 302, and a cap layer 310 formed on the barrier layer 308.

In some embodiments, the microwave radiation is applied to reduce interface dipoles formed between the high-k dielectric layer 302 and the interfacial layer 304. The interfacial dipoles rotate and/or vibrate in response to the microwave radiation, which results in friction between dipoles and/or surrounding atoms. As a result, heat is generated through such interactions between the dipoles and the microwave radiation. For example, the interfacial layer 304 includes silicon oxides, and the high-k dielectric layer 302 includes $HfO_x$. The interactions between the interfacial dipoles and the microwave radiation cause Si—O—Hf intermixing at the interface between the high-k dielectric layer 302 and the interfacial layer 304 so as to reduce the interfacial dipoles.

In certain embodiments, the semiconductor device structure 300 includes one or more junctions (e.g., the junction 312) that contain dopants. For example, the junctions are formed through epitaxial growth. The microwave radiation is also applied for dopant activation. For example, the microwave radiation can interact with free carriers and dipoles within the junctions to activate the dopants.

For example, the interfacial layer 304 includes a silicon oxide, HfSiO, SiON, or other suitable materials. The high-k dielectric layer 302 includes a binary or ternary high-k film, such as $HfO_x$, LaO, AlO, ZrO, TiO, $Ta_2O_5$, $Y_2O_3$, $SrTiO_3$ (SrTiO), $BaTiO_3$(BaTiO), BaZrO, HfZrO, or other suitable materials. The barrier layer 308 includes TiN, TaN, or other suitable materials, and the cap layer 310 includes amorphous silicon or other suitable materials. As an example, the layers 302, 304, 308 and 310 can be formed by atomic layer deposition (ALD), chemical vapor deposition (CVD), physical vapor deposition (PVD), metalorganic CVD, plasma-enhanced CVD, plasma-enhanced ALD, thermal oxidation, chemical oxidation, or other suitable techniques.

For example, the microwave radiation applied to the semiconductor device structure 300 has a frequency in the range of about 2 GHz to about 10 GHz. The semiconductor device structure 300 is pre-heated to a temperature in a range of 300° C. to 600° C. for the microwave-radiation annealing. The microwave radiation is applied to the semiconductor device structure 300 for a time period within a range of about 30 seconds to about 1200 seconds.

Figure 4:
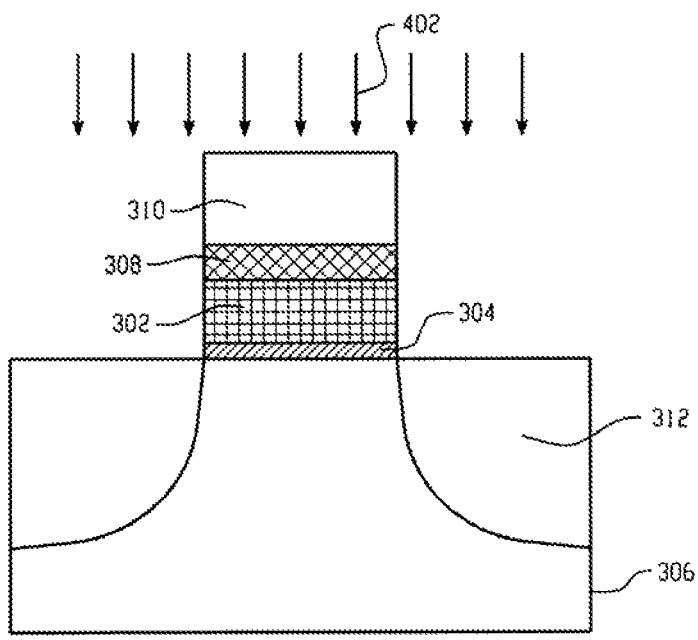
FIG. 4 depicts an example diagram for performing pre-amorphization implantation on a semiconductor device structure.

In some embodiments, the semiconductor device structure 300 has low microwave radiation absorption, and thus effective dopant activation is not easy to achieve using microwave radiation. For example, the junction 312 has a small number of defects which often leads to insufficient dipole formation within the junction to interact with the microwave radiation for dopant activation. Pre-amorphization implantation (PAI) may be performed on the semiconductor device structure 300 to increase microwave-radiation absorption of the semiconductor device structure for dopant activation, as shown in FIG. 4.

Before the dopants are introduced into the semiconductor device structure 300 (e.g., into the junction 312), PAI is performed (e.g., using a plasma doping technique) to inject certain implantation species 402 (e.g., ions) into the semiconductor device structure 300 (e.g., into the junction 312). In response, a pre-amorphization layer is formed in the semiconductor device structure 300 (e.g., in the junction 312). For example, the pre-amorphization layer contains a large amount of defects as a result of the implantation. As an example, the pre-amorphization layer includes an amorphous layer.

In some embodiments, the PAI is performed across the entire wafer, or over a portion of the wafer by using lithography to mask device regions under which the PAI may not be desired. As an example, the implantation species 402 includes boron-based materials (e.g., $B_2H_6$), silicon-based materials, phosphorous-based materials, arsenic-based materials, antinomy-based materials, germanium-based materials, helium, xenon, argon, or other suitable materials.

After the PAI process, dopants are introduced into the semiconductor device structure 300 (e.g., into the junction 312), e.g., through implantation or epitaxial growth. When the microwave radiation is applied, the semiconductor device structure 300 (e.g., the junction 312) undergoes solid-phase epitaxial re-growth in response to the microwave radiation. The microwave-radiation absorption of the semiconductor device structure 300 is increased because of the large amount of defects generated during the PAI process. More dipoles related to the dopants are formed in the semiconductor device structure 300 (e.g., in the junction 312), and these dipoles vibrate and/or rotate in response to the applied microwave radiation. As an example, the dipole formation and the dipole motions (e.g., vibration and/or rotation) eventually break down the bonds between the dopants and the interstitial sites in the semiconductor device structure 300 (e.g., in the junction 312), so that the dopants are activated. As an example, the dopants include phosphorous, phosphorous-based molecules (e.g., SiP, SiCP), germanium, germanium-based molecules (e.g., GeB, GeSnB, SiGeB), helium, boron, boron-based molecules, or a combination thereof. The dopant concentration is in a range from about $7 \times 10^{20}/cm^3$ to $5 \times 10^{21}/cm^3$.

Figure 5:
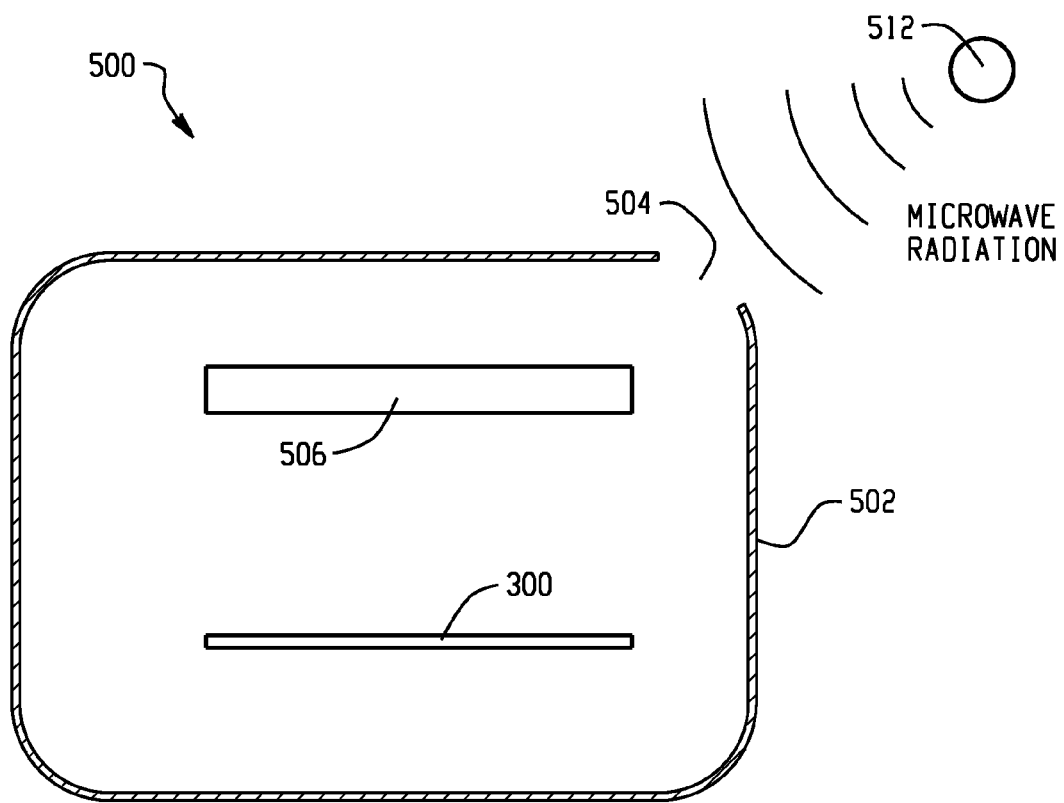
FIG. 5 depicts an example diagram showing a system for annealing a semiconductor device structure using microwave radiation.

FIG. 5 depicts an example diagram showing a system for annealing the semiconductor device structure 300 using microwave radiation. An energy-converting material 506 is placed at a distance from the semiconductor device structure 300 during the microwave-radiation annealing of the semiconductor device structure 300.

The energy-converting material 506 (e.g., with a loss tangent in a range of approximately 0.01 to approximately 2) absorbs sufficient microwave radiation and increases an oscillating electric field density over the semiconductor device structure 300. At the raised electric field density, more and more dipoles related to the dopants are formed in the semiconductor device structure 300, and these dipoles vibrate and/or rotate in response to the applied microwave radiation. Once the oscillating electric field density over the semiconductor device structure 300 exceeds a threshold, the dipole formation and the dipole motions (e.g., vibration and/or rotation) break down the bonds between the dopants and the interstitial sites in the semiconductor device structure 300 to activate the dopants. The oscillating electric field also reacts with interface dipoles through interfacial polarization which builds oscillating positive charges and/or negative charges at one or more interfaces, for example, between the high-k dielectric layer 302 and the interfacial layer 304 or between the interfacial layer 304 and a channel layer (e.g., including silicon or silicon germanium). For example, the distance between the energy-converting material 506 and the semiconductor device structure 300 is adjusted to improve the dopant activation. In some embodiments, PAI is performed on the semiconductor device structure 300 first, and then the semiconductor device structure 300 is placed in the system 500 for annealing.

As shown in FIG. 5, the system 500 includes a shell 502, and a microwave port 504 through which microwave radiation generated by a microwave-radiation source 512 is introduced into the shell 502. For example, the shell 502 is made of a metal material. As an example, the energy-converting material 506 is pre-heated to a predetermined temperature (e.g., in a range of about 300° C. to about 600° C.) by a heat source (e.g., an Ar lamp, a Xeon lamp, or a tungsten-halogen lamp). In some embodiments, the microwave radiation is applied with an ambient-control flow including less than 5 parts-per-million (ppm) oxygen.

For example, the energy-converting material 506 includes boron-doped silicon, phosphorous-doped silicon, silicon carbide (e.g., covered with aluminum), silicon phosphide, titanium, nickel, silicon nitride, silicon dioxide, or other suitable materials. In another example, the energy-converting material 506 has a much larger size than the semiconductor device structure 300 so that the electric field density may be approximately uniform over the semiconductor device structure 300.

In some embodiments, the semiconductor device structure 300 is placed between two energy-converting materials, where each energy-converting material is at a predetermined distance from the semiconductor device structure 300. In certain embodiments, an energy-converting layer is formed on the semiconductor device structure 300, e.g., through epitaxial growth, and the thickness of the energy-converting layer is adjusted to improve the dopant activation. In other embodiments, multiple (e.g., two) energy-converting layers are formed on different surfaces of the semiconductor device structure 300.

Figure 6:
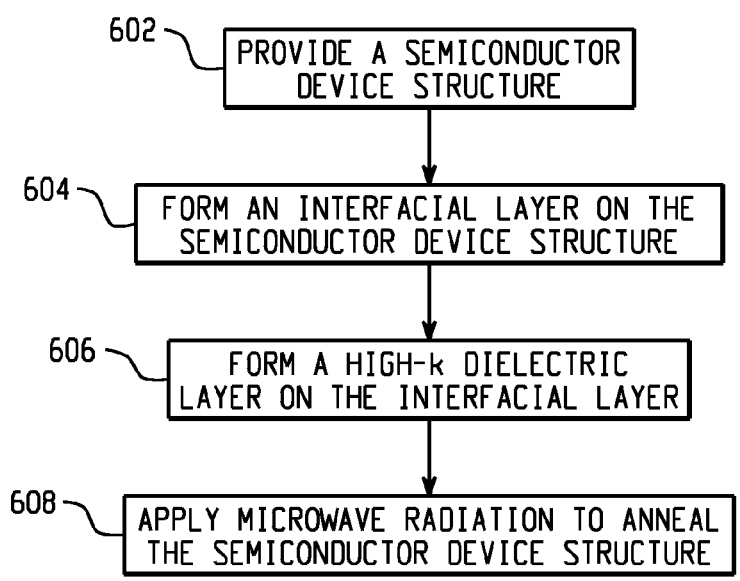
FIG. 6 depicts an example diagram showing a flow chart for annealing a semiconductor device structure using microwave radiation.

FIG. 6 depicts an example diagram showing a flow chart for annealing a semiconductor device structure using microwave radiation. At 602, a semiconductor device structure is provided. At 604, an interfacial layer is formed on the semiconductor device structure. At 606, a high-k dielectric layer is formed on the interfacial layer. At 608, microwave radiation is applied to anneal the semiconductor device structure for fabricating semiconductor devices.

In some embodiments, the microwave radiation is applied to reduce interface dipoles formed between the high-k dielectric layer and the interfacial layer or between the interfacial layer and a channel layer (e.g., including Si or SiGe). The interfacial dipoles rotate and/or vibrate in response to the microwave radiation by dipolar polarization heating, which results in friction between dipoles and/or surrounding atoms. The interfacial dipoles also react with microwave radiation by interfacial polarization which builds oscillating positive charges and/or negative charges at one or more interfaces (e.g., between the high-k dielectric layer and the interfacial layer or between the interfacial layer and the channel layer). As a result, heat is generated through such interactions between the dipoles and the microwave radiation. The interactions between the interfacial dipoles and the microwave radiation cause certain intermixing which will eventually reduce the interfacial dipoles.

In certain embodiments, the semiconductor device structure includes one or more epitaxially-junctions that contain dopants. The applied microwave radiation also causes dopant activation. For example, the microwave radiation can interact with free carriers and dipoles within the junctions to activate the dopants. In some embodiments, pre-amorphization implantation (PAI) is performed on the semiconductor device structure to increase microwave-radiation absorption of the semiconductor device structure for dopant activation. In certain embodiments, one or more energy-converting materials are disposed at a distance from the semiconductor device structure, or are formed on the semiconductor device structure. During the annealing process, the energy-converting materials increases an electric field density associated with the semiconductor device structure in response to the microwave radiation so that more dipoles related to the dopants are formed to improve dopant activation.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as on, over, etc. that are used for descriptive purposes only and are not to be construed as limiting. The embodiments of a device or article described herein can be manufactured, used, or shipped in a number of positions and orientations. For example, the term "on" or "over" as used herein (including in the claims) may not necessarily indicate that a first layer/structure "on" or "over" a second layer/structure is directly on or over and in immediate contact with the second layer/structure unless such is specifically stated; there may be one or more third layers/structures between the first layer/structure and the second layer/structure. The term "in" used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor device structure" used herein (including in the claims) may include a semiconductor substrate. The term "semiconductor device structure" used herein (including in the claims) may also include shallow trench isolation features, poly-silicon gates, lightly doped drain regions, doped wells, contacts, vias, metal lines, or other types of circuit patterns or features to be formed on a semiconductor substrate. In addition, the term "semiconductor device structure" used herein (including in the claims) may include various semiconductor devices, including transistors, capacitors, diodes, etc.

What is claimed is:

1. A method for annealing a semiconductor device structure using microwave radiation, the method comprising:
    providing a semiconductor device structure;
    forming an interfacial layer on the semiconductor device structure;
    forming a high-k dielectric layer on the interfacial layer;
    performing pre-amorphization implantation on the semiconductor device structure before application of microwave radiation; and
    applying microwave radiation to anneal the semiconductor device structure for fabricating semiconductor devices.

2. The method of claim 1, wherein the microwave radiation is applied to reduce dipoles formed at an interface between the high-k dielectric layer and the interfacial layer.

3. The method of claim 1, wherein:
    the semiconductor device structure includes one or more junctions on a substrate, the junctions including dopants; and
    the microwave radiation is applied to the semiconductor device structure to activate the dopants.

4. The method of claim 1, wherein the semiconductor device structure is pre-heated to a temperature within a range of approximately 300° C. to approximately 600° C.

5. The method of claim 1, wherein the microwave radiation has a frequency within a range of approximately 2 GHz to approximately 10 GHz.

6. The method of claim 1, wherein the microwave radiation is applied for a duration in a range of approximately 30 second to approximately 1200 seconds.

7. The method of claim 1, wherein one or more layers are formed on the high-k dielectric layer before the application of microwave radiation.

8. The method of claim 7, where the one or more layers include a barrier layer and a cap layer.

9. The method of claim 1, wherein an amorphous layer is formed in the semiconductor device structure after the pre-amorphization implantation.

10. The method of claim 1, wherein the pre-amorphization implantation is performed by injecting one or more implantation species into the semiconductor device structure.

11. The method of claim 10, wherein the one or more implantation species include boron, phosphorus, arsenic, antinomy, germanium, silicon, helium, xenon, or argon.

12. The method of claim 1, further comprising:
    providing one or more energy-converting materials capable of increasing the semiconductor device structure's absorption of microwave radiation;
    wherein the microwave radiation is applied to the energy-converting materials and the semiconductor device structure.

13. The method of claim 12, wherein the energy-converting materials are capable of increasing an electric field density associated with the semiconductor device structure in response to the microwave radiation so as to increase the semiconductor device structure's absorption of the microwave radiation.

14. The method of claim 12, wherein the energy-converting materials are placed at a distance from the semiconductor device structure.

15. The method of claim 12, wherein the energy-converting materials includes boron-doped silicon, phosphorous-doped silicon, silicon carbide, silicon phosphide, titanium, nickel, silicon nitride, or silicon dioxide.

16. The method of claim 12, wherein the energy-converting material has a loss tangent in a range of approximately 0.01 to approximately 2.

17. A method for annealing a semiconductor device structure using microwave radiation, the method comprising:
    providing a semiconductor device structure;
    forming an interfacial layer on the semiconductor device structure;
    forming a high-k dielectric layer on the interfacial layer;
    applying microwave radiation to anneal the semiconductor device structure for fabricating semiconductor devices; and
    providing one or more energy-converting materials capable of increasing the semiconductor device structure's absorption of microwave radiation,
    wherein the microwave radiation is applied to the energy-converting materials and the semiconductor device structure and further wherein the energy-converting materials are formed on the semiconductor device structure.

18. A method for annealing a semiconductor device structure using microwave radiation, the method comprising:
    providing a semiconductor device structure;
    forming an interfacial layer on the semiconductor device structure;
    forming a high-k dielectric layer on the interfacial layer; and
    applying microwave radiation to anneal the semiconductor device structure for fabricating semiconductor devices,
    wherein the microwave radiation is applied with an ambient-control flow including less than 5 ppm oxygen.

19. The method of claim 18, wherein the microwave radiation is applied to reduce dipoles formed at an interface between the high-k dielectric layer and the interfacial layer.

* * * * *